United States Patent [19]

Cuddy et al.

[11] 4,360,144
[45] Nov. 23, 1982

[54] PRINTED CIRCUIT BOARD SOLDERING

[75] Inventors: William A. Cuddy, Montague, N.J.; Basil Thir, Grosse Ile; Stephen E. Eisenstein, Oak Park, both of Mich.

[73] Assignee: BASF Wyandotte Corporation, Wyandotte, Mich.

[21] Appl. No.: 226,970

[22] Filed: Jan. 21, 1981

[51] Int. Cl.³ .................. B05D 5/12; B23K 31/02
[52] U.S. Cl. .................. 228/180 R; 228/224; 228/250; 427/96; 427/312; 29/840; 148/23
[58] Field of Search .................. 228/180 R, 224, 250; 29/839, 840; 148/23, 25, 24; 427/311, 312, 313, 96

[56] References Cited

U.S. PATENT DOCUMENTS

| | | | |
|---|---|---|---|
| 3,627,696 | 12/1971 | Heithaus et al. | 252/57 X |
| 3,755,886 | 9/1973 | Hermann | 228/224 X |
| 4,094,797 | 6/1978 | Newkirk et al. | 568/609 X |
| 4,127,692 | 11/1978 | Boynton | 228/180 R X |
| 4,140,554 | 2/1979 | Stayner et al. | 148/23 |

Primary Examiner—John D. Smith
Assistant Examiner—Bernard F. Plantz
Attorney, Agent, or Firm—Bernhard R. Swick

[57] ABSTRACT

The present invention relates to a method of wave soldering an assembly composed of a plurality of electrical conductors disposed on a surface of a sheet of insulating material. In accordance with this method, the surface of the sheet and the conductors are contacted with a stationary wave of molten solder having a polyether admixed therewith and floating on the surface thereof. The polyether is a heteric or block copolymer of a dihydroxyphenol and at least one lower alkylene oxide. It is preferred that the alkylene oxide contain 2 to 4 carbon atoms. The alkylene oxide may be all ethylene oxide or may be a mixture with other lower alkylene oxides such as propylene oxides and butylene oxides. In any event, the copolymer should contain at least about 20 percent by weight of oxyethylene groups, balance oxypropylene groups and/or oxybutylene groups. A conventional polymeric oxidation inhibitor may also be included.

16 Claims, 2 Drawing Figures

PRINTED CIRCUIT BOARD SOLDERING

BACKGROUND OF THE INVENTION

1. Field of the Invention

This invention relates to an improved method of soldering and more particularly to an improved method of soldering simultaneously all of the connections of an assembly which include the pluarlity of electrical conductors disposed on a surface of electrically insulating material.

2. Description of the Prior Art

Although various types of printed circuits have been utilized in the past, one common type comprises a sheet of electrically insulating material, such as laminated sheets of paper impregnated with a synthetic resin and carrying on one surface of the sheet, one or more electrical conductors in the form of thin, flat strips integrally united to the insulation material. Where it is desired to mount a number of circuit components on the other side of the sheet of insulating material and connect them at many points to the printed conductors on the side previously mentioned, there is a considerable problem in making the connections rapidly and efficiently. In a typical assembly, over 100 connections may be involved, and to make each one of these connections individually with a soldering iron is a tedious process. Consequently, it is desirable to be able to use a process which will enable an operator to solder all of the connections in the same operation or operations. One method of soldering all such connections simultaneously is a dip-soldering technique. In this type of process, the entire side of the assembly containing the printed conductors with the leads from the circuit components projecting through the various points, can be dipped face down in a bath of molten solder and removed after a brief period of immersion. This results in coating the conductors with solder and soldering all of the connections at the same time.

An alternative method of soldering all such connections is the wave soldering technique. Originally developed to eliminate the deficiencies and limitations of the dip-soldering techniques, wave soldering involves pumping the molten solder through a nozzle to form a standing wave. In this type of process, the entire side of the assembly containing the printed conductors, with the leads from the circuit components projecting through the various points, travels at a predetermined rate of speed in contact with the surface of the wave of molten solder. To put it in other terms, the lower surface of the assembly will kiss the surface of the wave.

In such apparatus, solder is melted in a steel pot, generally at a temperature about 350° to 650° F. and preferably about 400° to 550° F. It is then pumped with a centrifugal pump up through the nozzle which may contain a series of internal baffles until a surface is formed at the top of the bath. This is referred to as the wave. The gently overflowing wave of liquid solder flows back into the solder pot reservoir from which it is recirculated by pumping up through the nozzle. A properly functioning solder wave contributes to the wetting of the joining surfaces, promotes through hole penetration, and helps assure formation of reliable solder joints and fillets. Wave soldering permits many solder connections of high reliability to be made in one pass of a printed circuit board through the system, makes possible careful regulation of time and temperature exposure, and assures that each connection receives virtually identical treatment. Also, the dynamic motion of the wave creates a washing or scrubbing action against the printed circuit board which aids wetting or spreading of the solder in the joint area.

A typical system includes stations for applying flux to the circuit, preheating the circuit board and performing the wave soldering operation. A conveyor is generally used to move the board through these stages. Precleaning and/or post-cleaning stations may be incorporated into the system, but these functions are usually performed by separate units of the production line, in line with or off line from the soldering system.

Dwell time in the solder is controlled by the part travel or conveyor speed, wave shape and configuration and wave dimension in the direction of travel. Machines with adjustable wave widths are available which are capable of providing extended dwell time for the work piece and the solder wave at high conveyance speeds. The speed of the operation must be coordinated with the minimum practical and most economical solder temperature, efficiency and productivity of the operation, with consideration for the rate at which a fast moving part can extract heat from the system. All this can be easily determined by those skilled in the art with a minimum of trial and error. The wave should be even and should contact the entire lower surface of the board as it passes over the wave. It should be smooth enough to prevent solder from passing over the top of even the thinnest boards.

The most commonly used wave probably is the bidirectional wave, formed by using a high capacity centrifugal pump that pumps the solder into a nozzle with a large plenum chamber. The solder pot must have sufficient area to make the wave formation insensitive to small variations in the level of solder in the pot. A stable wave of heights exceeding one inch (to handle long component leads) is achieved by pumping solder from the pot into the nozzle. The solder is pumped upward, rising through the nozzle until it overflows the sides of the nozzle, propelled with enough velocity to form a standing wave clear of the nozzle itself. Carefully placed baffle screens within the plenum of the nozzle can be used to shape and control the rise of the solder through the nozzle. Modern standing wave soldering systems are capable of pumping wave widths from 2 to 24 inches and wave heights up to 3 and ¾ inch. They have relatively large solder capacities to insure consistency in soldering temperature and to compensate for heat loss and dissipation.

Oil intimately intermixed with the molten solder wave prevents dross formation on the wave, reduces the inherent surface tension of the solder, and the solder tends to spread more readily on clean conductor surfaces. The principal of the oil intermix is one in which oil is continuously fed to the input end of the solder pump. It is sucked in by the pump, intermixed with the solder and the mixture then driven to the surface. The oil dispersed in the solder then spreads out on the wave surface.

Cleaning is generally necessary after the soldering operation, particularly where oil is employed with the solder. Cleaning is most effective and quickly achieved immediately after the soldering operation while the boards are hot before the flux residues become hard. The liquid wave principle may also be employed with the cleaning compositions for the cleaning operation. Batch type cleaning using ultrasonic dip tanks and vapor degreasers as well as free-standing in line spray cleaning systems, may also be employed.

The liquid wave concept is a simple, practical and economic method of cleaning. The wave of cleaning solvent or liquid is pumped and formed in the same manner as a solder wave but with a far greater surface area. The height of the wave can be adjusted so that cleaning liquid just touches the bottom side of the printed circuit board assembly or is slightly submerged for a flushing action on the top side of the board as well.

The use of oil, intermixed with the molten solder requires solvent cleaning to remove the oil from the soldered assembly. Accordingly, it was discovered in the prior art that polyglycol-based fluids can be used in place of oil and that they permit wash-off with plain water rather than requiring a solvent for the cleaning. However, the prior art polyglycol-based fluids present serious problems of fuming at the elevated temperatures necessary for soldering.

Detailed discussions of wave soldering will be found in "Soldering Equipment, Wave or Cascade Type", pages 191 and 192 of the 1977 edition of *Insulation Circuits Desk Manual;* "Understanding the Solder Wave and Its Effects on Solder Joints, *Insulation/Circuits*", January 1978, pages 45 through 49 and "Guide to Wave Soldering Equipment, *Insulation/Circuits*", February 1977, pages 38 through 46.

STATEMENT OF RELEVANT PATENTS

To the best of applicants knowledge, the following patents are the ones most relevant to a determination of patentability.

| References |  |  |  |
|---|---|---|---|
| Patent No. | Issued | Inventor | Assignee |
| 3,803,246 | 4/9/74 | Rosenzweig et al | ICI America |
| 2,499,363 | 3/7/50 | DeGroote | Petrolite |
| 2,859,250 | 11/4/58 | Woodbridge et al | Atlantic Refining |
| 3,020,137 | 2/6/62 | Condo | Atlantic Refining |
| 3,525,715 | 8/25/70 | Schaftenau et al | Sandoz |
| 3,054,174 | 9/18/62 | Rose et al | RCA |
| 3,690,943 | 9/12/72 | Papiano | RCA |
| 3,214,827 | 11/2/65 | Prohofsky | Sperry Rand |
| 4,144,178 | 3/13/79 | Katabe et al | Kao Soap Co. |
| 4,094,797 | 6/13/78 | Newkirk et al | BASF Wyandotte |
| 2,671,264 | 3/19/54 | Pessel | RCA |
| 2,740,193 | 4/3/56 | Pessel | RCA |

U.S. Pat. No. 3,803,246—discloses oxyalkylated diphenol compositions which are obtained by reacting a diphenol compound with alkylene oxide. Various diphenols are listed but the preferred diphenol is 2,2-bis(4-hydroxyphenyl)propane, i.e., Bisphenol A. It may be prepared by first reacting alkylene oxide with the diphenol in the presence of lithium alkoxylation catalysts and then reacting the resulting oxyalkylated diphenol with additional alkylene oxide. The alkylene oxides are preferably 1,2-alkylene oxides such as ethylene oxide, 1,2-propylene oxide and 1,2-butylene oxide. Mixtures of alkylene oxides may also be employed.

U.S. Pat. No. 4,094,797—discloses as an intermediate compound a heteric or block copolymer of alkylene oxides and dihydroxyphenols. Lower alkylene oxides are disclosed, preferably selected from the group consisting of ethylene oxide, 1,2-propylene oxide and 1,2-butylene oxide, and the dihydroxyphenol can be 2,2'-bis(4'-hydroxyphenyl)propane, i.e., Bisphenol A.

U.S. Pat. Nos. 2,499,363; 2,859,250; 3,020,137; 3,525,715, and 4,144,178—disclose oxyalkylated diphenols.

All of the above patents fail to teach or even suggest the use of the disclosed compounds in soldering printed circuit boards.

U.S. Pat. No. 3,054,174—discloses a method of attaching a connector wire to a semi-conductor device which includes a soft metallic electrode having a melting point lower than that of the semi-conductor. One end of the wire is inserted into the electrode and then the wire bonded to the electrode by heating the device and wire in a bath maintained at a temperature above the melting point of the electrode. Among the compounds suggested for the bath are polyethylene glycols. This patent does not relate to soldering printed circuit boards.

U.S. Pat. Nos. 3,690,943 and 3,214,827—relate to printed circuit boards and soldering thereof through the use of a hot oil-type bath. The materials employed in the bath are generally paraffins, fats and mineral and vegetable oil. There is no disclosure of the use of compounds even similar to that employed in the instant invention. Further, there is no disclosure of the use of a solder wave. While U.S. Pat. No. 3,690,943 discloses the use of a wave technique, a continuous wave of heat transfer fluid is employed rather than solder.

U.S. Pat. Nos. 2,740,193 and 2,671,264—disclose processes which comprise immersing the underface of a printed circuit board assembly in a conventional bath of molten solder. In U.S. Pat. No. 2,740,193, a second solder bath is employed which may be similar to that in the first bath and contains a top layer of a relatively inert organic liquid. However, neither of these patents disclose a solder wave and in U.S. Pat. No. 2,740,193, the relatively inert organic liquid specified is an organic derivative of organic phosphorus compounds alone or in combination with an organic acid or derivatives thereof having a carboxyl group, or in combination with an oil, wax or resin.

It is the purpose of the instant invention to provide a method of soldering, particularly wave soldering, a plurality of electrical conductors disposed on a surface of a sheet of insulating material wherein problems of economic loss due to loss of oil or polyglycol-based fluids, as well as atmospheric pollution as a result of fuming at the temperatures necessary for soldering are eliminated or substantially reduced.

SUMMARY OF THE INVENTION

This and other objects are achieved by the present invention which relates to a method of wave soldering an assembly composed of a plurality of electrical conductors disposed on a surface of a sheet of insulating material. In accordance with this method, the surface of the sheet and the conductors are contacted with a stationary wave of molten solder having a polyether admixed therewith and floating on the surface thereof. The polyether is a heteric or block copolymer of a dihydroxyphenol and at least one lower alkylene oxide. It is preferred that the alkylene oxide contain 2 to 4 carbon atoms. The alkylene oxide may be all ethylene oxide or may be a mixture with other lower alkylene oxides such as propylene oxides and butylene oxides. In any event, the copolymer should contain at least about 20 percent by weight of oxyethylene groups, balance oxypropylene groups and/or oxybutylene groups. More specifically, the copolymer may contain about 20 to 100 percent oxyethylene groups, balance oxypropylene groups and/or oxybutylene oxide groups. While substantial improvement over the prior art, with respect to the purposes of the instant invention, is achieved through the use of the polyether copolymer, an even greater improvement is effected by the inclusion of a conventional polymeric oxidation inhibitor.

DETAILED DESCRIPTION

Figure 1:
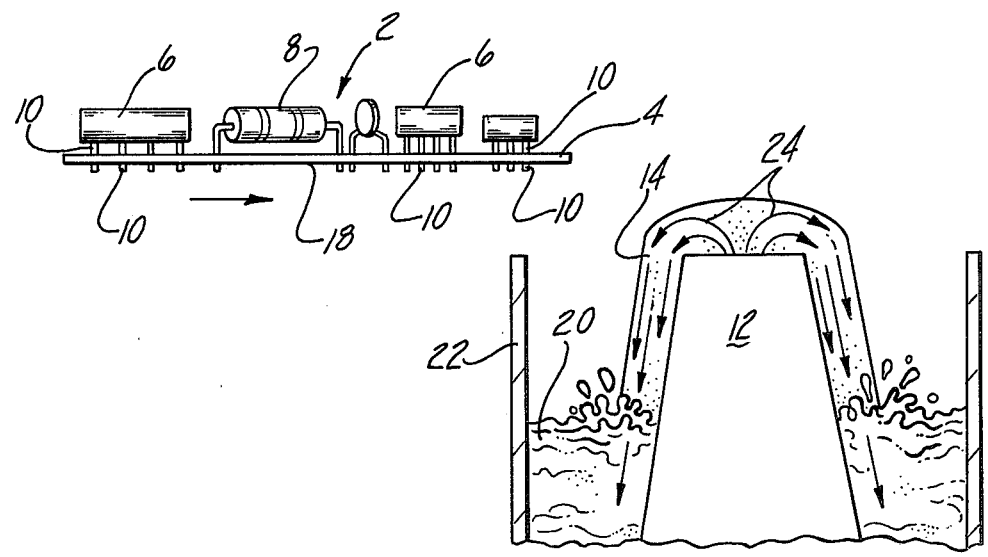
FIG. 1 is a sectional view of a solder container and solder wave and an assembly of electrical conductors disposed on a surface of a sheet of insulating material approaching said solder wave prior to actual contact therewith.

In the process of the present invention, a continuous wave of molten solder having a polyether admixed therewith and floating on the surface thereof, is caused to be gently wiped against the surface of the assembly of electrical conductors. The continuous flow of the wave provides uniform heat distribution which results in maximum efficiency of heat transfer. This wave of solder provides continuous replenishing of the fluid as it flows against the surface soldered providing agitation and assuring a substantially constant temperature of the heat transfer fluid. In accordance with the instant invention, this temperature is preferably maintained at about 350° to 650° F., preferably 400° to 550° C. The gentle wiping action ensures that no excessive forces are exerted against the surfaces to be soldered which may otherwise cause the coating to be unevenly distributed or removed from the surface. The process of the instant invention provides a process readily adaptable to automatic processing techniques in that the surfaces to be contacted with the solder wave may be continuously conveyed into contact with the wave. The continuous relative motion between the fluid and the coated surface also tends to wipe away loosely adherent particles such as loosely adhered stringers or the like.

In order to inhibit dross, a polyether copolymer is pumped together with the solder through the nozzle forming the solder wave thereby maintaining a layer of the polyether copolymer on the surface of the wave at all times. This is done preferably by the intermixing system wherein the copolymer returning with the solder to the pot is fed to the impeller of the solder pump. There the copolymer is finely dispersed, spreading copolymer droplets uniformly throughout the solder, so that a copolymer solder mixture is pumped upward forming the wave. The copolymer liquid may also be introduced into the wave by pumping directly to the base of the wave by a separate unit to surface together with the solder. The copolymer intermixed in the wave not only reduces or prevents dross formation but it also reduces the inherent surface tension of the solder. Intermixed with the copolymer the solder tends to spread more readily on the clean surfaces of the assembly. The assembly or the connections to be soldered may be fluxed in any conventional manner prior to contact with the solder wave and generally will be cleaned subsequently. However, with the instant invention, cleaning may be accomplished with plain water whereas the use of the oils of the prior art requires solvent cleaning.

The amount of polyether copolymer in the solder should be sufficient to form a surface film layer on the top of the solder wave during the soldering operation. This can be easily determined by one skilled in the art through a simple trial and error test. However, the preferred amount of polyether copolymer should be from about 0.5 to 2.00 and most preferably 0.1 to 1.0 percent by weight of the solder.

While the polyether may be either a heteric or block copolymer of a dihydroxyphenol and at least one lower alkylene oxide, a heteric copolymer of alkylene oxides having from 2 to 4 carbon atoms is preferred. The alkylene oxide may be all ethylene oxide or may be a mixture of ethylene oxide with propylene oxide and/or butylene oxide, but in any event, the copolymer should contain at least about 20 percent by weight oxyethylene groups, i.e., 20 to 100 percent by weight oxyethylene groups, balance oxypropylene groups and/or oxybutylene groups.

The preferred dihydroxyphenol is 2,2-bis(4-hydroxyphenyl)propane, commonly known as Bisphenol A. Illustrative examples of diphenols which may be used in the process of the invention include 4,4'-diphenol-sulfide, 4,4'-diphenyl sulfone, 2,2-bis(4-hydroxy-3-methylphenyl)propane, 2,2-bis(4-hydroxyphenyl)butane, 2,2-bis(4-hydroxy-3-ethyl-phenyl)propane, 2,2-bis(4-hydroxy-3-propyl-phenyl)propane, 2,2-bis(4-hydroxy-3-butyl-phenyl)propane, 2,2-bis(4-hydroxy-2-methyl-phenyl)propane, 2,2-bis(4-hydroxy-2-propyl-phenyl)propane, 2-(4-hydroxy-phenyl)-2-(4-hydroxy-3-methyl-phenyl)propane, 2-(4-hydroxyphenyl)-2-(4-hydroxy-3-propyl-phenyl)propane, 2-(4-hydroxy-3-methyl-phenyl)-2-(4-hydroxy-3-butyl-phenyl)propane and the like. Mixtures of the above diphenols may also be used.

In general the preferred polyether copolymer has the following formula:

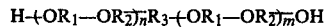

wherein $R_1$ and $R_2$ are the same or different lower alkylene oxides preferably selected from the group consisting of ethylene oxide, 1,2-propylene oxide and butylene oxide; $R_3$ is at least one dihydroxyphenol and $m+n$ is such that the compound has a molecular weight of about 500 to 3000, preferably 1000 to 3000. The oxyalkylene groups in the copolymer preferably contain by weight about 20 percent to 75 percent oxyethylene groups and about 80 percent to 25 percent oxypropylene and/or oxybutylene groups. The preferred range is by weight about 25 to 50 percent oxyethylene groups and about 75 to 50 percent oxypropylene and/or oxybutylene groups. Compounds of this type and methods of preparation are disclosed in U.S. Pat. No. 3,803,246.

As previously stated, further improvement with respect to the purposes of the instant invention is achieved by the inclusion of a conventional polymeric oxidation inhibitor. A preferred inhibitor is the reaction product which is formed by reacting in the presence of Friedel-Crafts type catalyst, one mole of a dicyclopentadiene and at least one mole of a p-cresol and further reacting the reaction product of these two with at least one-half mole of isobutylene. The preferred amount of inhibitor which may be employed ranges from about 0.05 to 0.45 weight percent based on the weight of polyether copolymer. Preferably, however, the amount of inhibitor is about 0.25 weight percent based on the weight of the polyether copolymer. The two-stage reaction products are mixtures of compounds having the following structural formula:

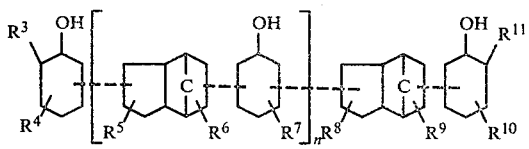

wherein $R^3$ and $R^{11}$ are tertiary alkyl radicals having from 4 to 6 carbon atoms and wherein $R^4$, $R^7$ and $R^{10}$ are selected from the group consisting of hydrogen, methyl, ethyl and tertiary alkyl radicals having from 4 to 6 carbon atoms and wherein $R^5$, $R^6$, $R^8$, and $R^9$ are selected from the group consisting of hydrogen and methyl and wherein n is 0 or a positive integer of 1, 2 or 3.

In the above list of compounds $R^3$ and $R^{11}$ may be selected to be the same or different. The same is true of $R^4$, $R^7$ and $R^{10}$ and $R^5$, $R^8$ and $R^9$. The dicyclopentadiene variety and $R^3$, $R^4$, $R^7$, $R^{10}$ and $R^{11}$ may be attached to either the ortho, meta or para positions of the phenolic varieties, most preferably the ortho or para positions. Preferred compounds are those where tertiary alkyl groups are attached ortho to the OH group.

The specific process conditions for the preparation of the iinhibitor may be found in U.S. Pat. No. 3,751,375, the disclosure of which is incorporated herein by reference.

An organic acid, preferably a linear organic acid, of 12 to 22 carbon atoms and most preferably oleic acid may be added to the solder or to the polyether copolymer to reduce and/or saponify the tin-lead oxides that form during the process. Preferably, such organic acid should be in an amount of about 1 to 10 percent by weight of the copolymer and preferably 3 to 7 percent by weight.

A preferred example of a process in accordance with the present invention is as follows:

EXAMPLE 1

Referring now to the drawing, and particularly FIG. 1 thereof, an assembly 2 comprising a mounting plate 4 which may be composed of laminated sheets of paper impregnated and surfaced with a synthetic resin is prepared for soldering. Mounting plate 4 has disposed on a surface thereof an electrical circuit composed of a plurality of leads or conductors, for example, fine strips of copper foil. The strips are intregrally united to a surface of the synthetic resin-impregnated plate 4. Mounted on the side of the mounting plate 4 which is opposite that of the electrical circuit, are a plurality of circuit components such as capacitors 6 and resistors 8. These circuit components are provided with wire leads 10 which project through the plate 4. Small diameter holes are provided in the plate 4 to accommodate the wire leads.

In carrying out the soldering operation, the lower side of this assembly 2 is first cleaned and dried and then brought into contact with a flux such as a solution of alcoholic resin. It is then conveyed in the direction of the arrow of FIG. 1 by conveyor means (not shown) in a conventional manner at a uniform predetermined rate, for example, at a constant rate in the range of 0.5 to 10 and preferably 3 to 7 feet per minute. Generally, the conveyor means is also employed in connection with the cleaning, drying and fluxing steps. The optimum conveying rate is sufficiently slow such that the soldering will be completed while at the same time being sufficiently fast to prevent burning the board or otherwise degrading it due to over exposure to the solder. The molten solder may be of any conventional composition such as 63 percent tin and 37 percent lead which is pumped through a nozzle 12 to form a standing wave 14 having a predetermined flow rate. For example, the fluid may be pumped at a pressure in the range of 5 to 10 psig through a rectangular nozzle 12 having an aperture of approximately ½ inch by 12 inches.

Figure 2:
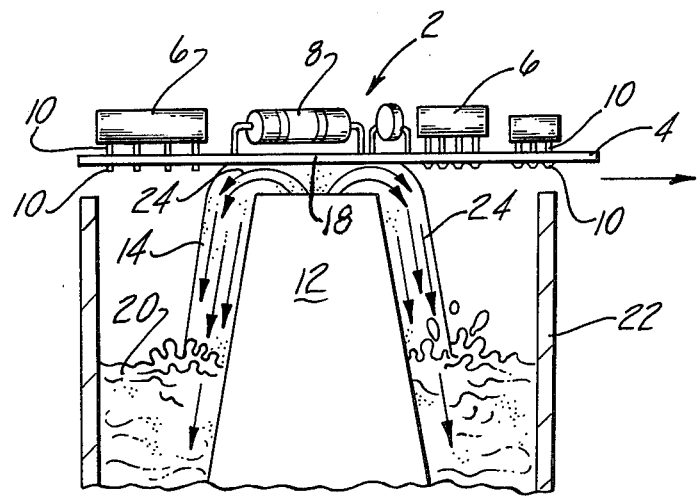
FIG. 2 is a sectional view of the solder wave and assembly of FIG. 1 with the lower surface of the assembly in contact with the surface of the solder wave.

In FIGS. 1 and 2, an end view of the wave is shown, the wave being elongated into the paper. The wave 14 is as long into the paper as the plate 4 is wide into the paper, such that the wave 14 will be in contact with the plate 4 along the entire underside surface 18 thereof as the board is conveyed in the direction of the arrow as shown in FIG. 2. The solder 20 is stored in a suitable container 22 and pumped through the nozzle 12 in the direction 24 to a predetermined height by a suitable pump (not shown) after which it cascades over the nozzle as indicated. The nozzle 12 may be provided with internal baffles (not shown) and the baffles and the nozzle may be of cold rolled steel coated with the 63 percent lead, 37 percent tin solder. The flow direction 24 of wave 14 is against surface 18 of plate 4 as shown in FIG. 2, surface 18 being in a position where it is oriented to face wave 14. More specifically, the plate 4 is spaced above the nozzle 12 in a predetermined relation to the height of the wave 14 such that the fluid, that is the solder 20 will flow against and in essence just kiss the underside or undersurface 18 of mounting plate 4. The means for heating and pumping the fluid are conventional.

The solder 20 is heated to a temperature sufficiently high to liquify the lead-tin solder. For example, with a eutectic lead-tin composition of 63 percent tin and 37 percent lead, it has been found that a temperature of 460° F. to 490° F. would be satisfactory.

A copolymer is mixed with the solder 20, pumped up through the nozzle 12 with the solder and forms a thin coating on the upper surface of the solder wave after which it flows back into the container 22 with the solder. The solder mixture and copolymer are returned to the pump for pumping up through the nozzle 12 etc.

The copolymer is prepared as follows: 1937 grams of a polyether polyol, available on the market, which is the reaction product of Bisphenol A with 7.5 moles of propylene oxide, is charged into a clean, dry nitrogen filled one-gallon autoclave along with 6 grams of 90 percent potassium hydroxide flakes. After purging with nitrogen and pressure checking, the mixture is heated to 125° C. and evacuated to less than 10 millimeters of mercury. The mixture is then stripped at 125° C. and less than 10 millimeters of mercury for 30 minutes. The vacuum is relieved through the feed line with nitrogen to 0 to 2 psig. A mixture of 403 grams of propylene oxide and 560 grams of ethylene oxide is added at a rate of 300 to 400 grams per hour at a maximum of 90 psig and 125° C. When the addition is complete, the reaction mixture is allowed to react to constant pressure for 2 to 3 hours. The reaction is allowed to cool to 80° C. and vented through a trap. The product is discharged through a nitrogen filled container, deionized, filtered and stripped at 105° C. The resultant product has a hydroxyl number of 123.2, a molecular weight of 911 and a ratio of oxyethylene groups to oxypropylene groups of 25:75.

In addition to the copolymer, an organic acid such as oleic acid may also be added to the solder in the container 22. Oleic acid is added to almost all conventional solder oils to reduce the tin-lead oxides that form during the process. The amount of oleic acid should be about 3 to 7 percent.

Upon removal of the assembly 2 from the contact with the solder, the strips of copper foil will be found to be completely coated with solder and all of the leads 10 soldered to the strips. The assembly 2 and particularly the lower portion of mounting plate 4 and the solder joints, are then cleaned by conventional means generally while still being moved by the conveyor into or through the cleaning apparatus. One of the advantages of applicants' invention lies in the fact that the cleaning may be accomplished with plain water and organic solvents are not required. Other methods of soldering printed circuit boards generally require some kind of organic solvent which, in itself, must later be removed.

EXAMPLES 2–15

The method of Example 1 is repeated with the exception that the copolymers in the table below are substituted in each example for the copolymer of Example 1.

These copolymers were prepared from Bisphenol A in the same manner as described above for Example 1. The hydroxyl number, molecular weight and ethylene oxide:propylene oxide ratio are shown in the Table below.

TABLE

| Examples | Hydroxyl Number | M Weight | Ratio of EO:PO |
|---|---|---|---|
| 2 | 65.0 | 1726 | 25:75 |
| 3 | 39.0 | 2876 | 26:74 |
| 4 | 62.4 | 1798 | 50:50 |
| 5 | 42.7 | 2628 | 50:50 |
| 6 | 63.3 | 1773 | 54:46 |
| 7 | 79.6 | 1410 | 51:49 |
| 8 | 93.9 | 1195 | 25:75 |
| 9 | 78.4 | 1431 | 25:75 |
| 10 | 125.0 | 898 | 79:21 |
| 11 | 64.0 | 1753 | 24:76 |
| 12 | 49.5 | 2267 | 75:25 |
| 13 | 35.7 | 3142 | 75:25 |
| 14 | 60.7 | 1848 | 75:25 |
| 15 | 27.5 | 4080 | 80:20 |

The copolymer of Example 3 also contains a polymeric oxidation inhibitor sold under the trademark WINGSTAY L which is a mixture of compounds having the following structural formula:

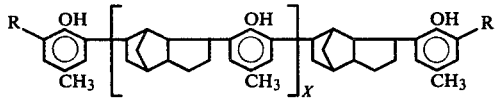

wherein R is predominantly isobutyl and X is reputed to have an average value of about 2.

The big advantage of applicants' invention lies in a longer life time of the equipment, ease of the removal of the oleic acid which is conventionally employed and often difficult to remove, less fuming and therefore less air pollution and increased copolymer life.

The foregoing examples and method have been described in the foregoing specification for purposes of illustration. Many other modifications will naturally suggest themselves to those skilled in the art based on this disclosure. These are intended to be comprehended as being within the scope of the invention.

What is claimed is:

1. A method of wave soldering an assembly comprised of a plurality of electrical conductors disposed on a surface of a sheet of insulating material comprising contacting said surface of said sheet and said conductors with a stationary wave consisting essentially of molten solder and a polyether admixed therewith and floating on the surface thereof, said polyether being the heteric or block copolymer of a dihydroxyphenol and at least one lower alkylene oxide, said copolymer containing at least about 20 percent by weight oxyethylene groups.

2. The method of claim 1 wherein said lower alkylene oxide contains 2 to 4 carbon atoms.

3. The method of claim 2 wherein said dihydroxy phenol is 2,2-bis(4-hydroxyphenyl)propane.

4. The method of claim 2 wherein said copolymer has a molecular weight of about 500 to 3000.

5. The method of claim 4 wherein the amount of said copolymer is about 0.05 to 2.0 percent by weight of said solder.

6. The method of claim 5 wherein said dihydroxy phenol is 2,2-bis(4-hydroxyphenyl)propane.

7. The method of claim 5 wherein said molten solder is at a temperature of about 350° to 650° F.

8. The method of claim 5 wherein said solder also contains a copolymer of dicyclopentadiene and para cresol.

9. The method of claim 5 wherein said solder also contains an organic acid of from about 12 to 22 carbon atoms.

10. The method of claim 9 wherein said solder also contains a copolymer of dicyclopentadiene and para cresol.

11. The method of claim 9 wherein said dihydroxy phenol is 2,2-bis(4-hydroxyphenyl)propane.

12. The method of claim 9 wherein said solder is at a temperature of about 350° to 650° F.

13. The method of claim 10 wherein said solder is at a temperature of about 350° to 650° F.

14. The method of claim 13 wherein said dihydroxy phenol is 2,2-bis(4-hydroxyphenyl)propane.

15. The method of claim 14 wherein said organic acid is oleic acid.

16. In a method of wave soldering an assembly comprised of a plurality of electrical conductors disposed on a surface of a sheet of insulating material comprising contacting said surface of said sheet and said conductors with a stationary wave consisting essentially of molten solder and a polyether admixed therewith and floating on the surface thereof, the improvement for eliminating or substantially reducing fuming at elevated temperatures wherein said polyether is the heteric or block copolymer of a dihydroxyphenol and at least one lower alkylene oxide, said copolymer containing at least about 20 percent by weight oxyethylene groups.

* * * * *